United States Patent [19]

Rooke

[11] Patent Number: 5,535,067
[45] Date of Patent: Jul. 9, 1996

[54] FREQUENCY CONTROLLED REFERENCE CLOCK GENERATOR

[75] Inventor: Matthew W. Rooke, San Jose, Calif.

[73] Assignee: International Business Machines Corporation, Armonk, N.Y.

[21] Appl. No.: 400,621

[22] Filed: Mar. 6, 1995

Related U.S. Application Data

[63] Continuation of Ser. No. 60,291, May 10, 1993, abandoned.
[51] Int. Cl.$^6$ .................................................. G11B 27/32
[52] U.S. Cl. .............................. 360/51; 331/25; 327/159; 327/160
[58] Field of Search ................... 331/1 A, 25; 360/73.03, 360/51; 327/159, 160

[56] References Cited

U.S. PATENT DOCUMENTS

| | | | |
|---|---|---|---|
| 4,862,485 | 8/1989 | Guinea et al. | 327/159 X |
| 5,121,280 | 6/1992 | King | 360/73.03 X |
| 5,146,183 | 9/1992 | Wilson | 331/1 A |
| 5,218,491 | 6/1993 | Nishida et al. | 360/73.03 |
| 5,309,418 | 5/1994 | Suzuki | 360/78.14 X |

OTHER PUBLICATIONS

Paul R. Gray and Robert G. Meyer, "Analysis and Design of Analog Integrated Circuits, 2nd Edition," date unknown, pp. 615–616.

Primary Examiner—Aristotelis Psitos
Assistant Examiner—James L. Habermehl
Attorney, Agent, or Firm—Ingrid M. Foerster; Paik Saber

[57] ABSTRACT

The invention is a write clock generator circuit adapted for use in disk drives having either dedicated servo or sector servo architecture. A high frequency write clock signal is generated from a relatively low frequency reference signal synchronized to disk rotation. The reference signal may originate from a number of sources, including a dedicated servo pattern, a sector servo pattern, any index pattern, or a spindle pulse. A clock generates a clock signal having a predetermined number of cycles for each reference period. A counter coupled to the output of the clock counts the number of clock cycles generated for each reference period. The number of cycles is then compared to an expected number corresponding to a desired clock frequency. If the compared numbers are not the same, an error signal is generated. Control logic receives the error signal and the reference signal, and generates an appropriate control signal. The control signal is coupled to the clock and thereby adjusts the write clock signal frequency.

28 Claims, 5 Drawing Sheets

SYNCHRONOUS WRITE CLOCK GENERATOR

SYNCHRONOUS WRITE CLOCK GENERATOR

FREQUENCY CONTROLLED REFERENCE CLOCK GENERATOR

This is a continuation of application Ser. No. 08/060,291, filed May 10, 1993, now abandoned.

BACKGROUND OF THE INVENTION

1. Field of the Invention

The present invention relates generally to apparatus for generating a variable frequency reference clock for use in disk drives. In particular, the invention is a circuit for generating a write clock synchronized to the rotation of the disk and suitable for both dedicated servo and sector servo architectures.

2. Description of the Prior Art

Disk drives typically include at least one disk for storing information, a spindle, a spindle controller for controlling disk rotational speed, a read/write head, an actuator, read and write signal generator, and a channel.

The disk is coated with magnetic material and divided into concentric tracks. The tracks are further divided into two or more sectors having radially oriented boundaries.

The disk is rotated by the spindle, and speed of rotation is determined by the spindle controller. The actual rotation speed varies with respect to a nominal frequency.

The channel forms an interface between the disk drive and a central processing unit (CPU). During a write operation, packets of binary digitized information are received by the channel. These packets, or blocks, may be of fixed length as in a conventional fixed block architecture (FBA), or of variable length, as in a conventional count-key-data (CKD) architecture. The information received contains both data and address information. Data is encoded by the write signal generator, synchronized to a write clock, and transmitted to the read/write head. Concurrently, address information is provided to the actuator. The actuator uses the address information in conjunction with positional information residing on one of the disks to position the head over an appropriate track. The data is then recorded into the appropriate area of the media by the read/write head.

The amount of data written to a track will vary with the write clock frequency and the disk's speed of rotation. The write clock frequency will be dictated by the desired "bit density". In other words, the write clock frequency must be sufficient to enable a certain quantity of information to be written to a track as the disk rotates at a given speed.

As one moves away from the center of a disk, the physical length of a track increases. Thus, if the write clock frequency remains constant over the entire surface of a disk, the number of bits written per track remains constant, but bits at the outer region of the disk surface will be spaced at greater distances from each other than bits at the inner region of the disk.

One data recording method is directed to enhancing the bit density across the disk, thus making use of otherwise wasted disk space. In "zoned" or "constant density" recording, a disk surface is partitioned into a number of concentric zones, each zone comprising a plurality of tracks. The write clock is readjusted at the inner track of each zone to achieve a bit density substantially equivalent to that of the innermost disk track. As a result, the amount of information stored within each zone increases with distance away from the center of the disk.

To assure equal spacing between data bits written to a disk surface, the write clock may be synchronized to disk rotation. Thus fluctuations in disk speed will not adversely affect bit spacing. Data integrity is further enhanced by inserting spaces or "gaps" between records of data as they are written to the disk. Such the gaps guard against the inadvertent overwriting of data in subsequent writes that may result from an inaccurately positioned head.

There are two conventional methods for storing positional or "servo" information in a disk drive. In a "dedicated servo" architecture, all servo information is located on one predetermined disk surface, and the remaining disk surfaces are reserved exclusively for data. In contrast, servo information and data both reside on the each disk surface in "sector servo" architectures. The servo information is typically located along two or more radial sector boundaries.

Data is read from the disk in a manner similar to that for writing data. A read instruction and address information are received by the channel from the CPU. The channel relays address information to the actuator, which uses the address and positional information on one of the disks to position the head over a desired track. The head synchronizes itself to the regularly spaced data on the track, then transduces the magnetic patterns into encoded data. The data is then decoded by the read signal generator and is transmitted through the channel to the CPU.

A number of methods have been employed in the past to generate data write clocks in disk drives. These generally involve either an asynchronous or a synchronized clocking scheme. Asynchronous write clocks are usually provided by crystal oscillators. But asynchronous clocks are unable to track variations in disk rotation speed in order to consistently space the magnetic patterns. For this reason, the protective gaps between data blocks must be large enough to accommodate such variations and to prevent overwriting of previously recorded data.

In a fixed block architecture (FBA), the size of a data block is consistent, e.g. 512 bytes per block. FBA block sizes are relatively small. For this reason the increase in gap size required with the use of an asynchronous write clock may be perfectly acceptable. In contrast, variable block formats such as CKD may be thousands of bytes in length, and the corresponding increase in gap size may be impractical.

To solve this problem, previous CKD applications have employed write clocks synchronized to disk rotation. Perhaps the most common method for generating a synchronous clock is with the phase locked loop (PLL) circuit. A reference signal is read from a dedicated servo disk and provided to the PLL circuit. The PLL circuit multiplies the reference signal to generate a higher frequency clock signal. Since the reference signal is synchronized to disk rotation, the clock signal accurately reflects variations in disk speed. Consequently, gap size requirements are minimized as compared to the asynchronous clocking method.

There are several disadvantages associated with the use of a PLL circuit, however. First, the reference signal supplied to the PLL must have a frequency on the order of ½ to 1/20 of the desired clock frequency. This requirement limits the application of PLL's to dedicated servo architectures, since only dedicated servo disks may be encoded with a pattern which is continuous throughout each complete rotation of the disk. Moreover, writing suitable servo patterns requires costly manufacturing equipment. In addition, PLL's are not well-suited to implement zoned recording because they are designed to operate at a fixed frequency. Finally, clock signals generated by a PLL exhibit "jitter" or high frequency modulation caused by the high bandwidth control loop required to accurately track changes in the disk velocity.

This jitter appears on the recorded data, increasing the possibility of retrieving faulty data.

Attempts have been made to reduce PLL jitter. For example, U.S. Pat. No. 4,818,950 entitled "Low Jitter Phase-Locked Loop" by M. H. Ranger discloses a PLL having an averaging operation and reduced error-correction circuitry. The averaging operation minimizes noise and "bit jitter". Bit jitter is defined as an irregularity in both the incoming signal and the reference signal manifested in a slightly premature or slightly late rising or falling edge. The reduced error-correction circuitry reduces the effects of electrical variations in purportedly identical circuit components. But such attempts do not resolve the limitations of PLL circuits previously mentioned.

What is needed is a clock generating circuit for producing a synchronous high frequency write clock signal from a relatively low frequency reference signal, e.g. as low as one cycle per disk revolution. The low frequency reference signal should be provided by either dedicated servo or sector servo patterns, or from the spindle controller. In addition, the synchronous clock should minimize gap size requirements so that it is well-suited for either FBA or CKD architectures. Finally, the clock generator must be capable of fast and frequent readjustment as required by zoned recording.

SUMMARY OF THE INVENTION

The invention is a circuit which generates a high frequency write clock signal for a disk drive from a relatively low frequency reference signal synchronized to disk rotation. In the preferred embodiment, a clock signal generator receives the reference signal and generates a clock signal of a frequency proportional to the reference signal. A counter coupled to the output of the clock signal generator counts the number of clock cycles generated for each period of the reference signal. The number of cycles is then compared to an expected number corresponding to the desired bit spacing. If the compared numbers are not the same, an error signal is generated. A control circuit receives the error signal and transforms it into an appropriate control signal. The control signal is supplied to the clock generating means and thereby adjusts the write clock signal frequency upwards or downwards.

The present invention offers significant advantages over the prior art. The synchronous reference signal may be generated in a number of ways so that it can be used on either dedicated servo or sector servo applications. For example, the signal may be provided by dedicated servo patterns or sector servo patterns read from the rotating disk. Alternatively, it may be generated directly by the spindle controller. This flexibility liberates the system designer from architectures requiring costly manufacturing equipment.

Another advantage is the clock signal tracking capability. If the clock signal is used as a write clock, it will synchronize data to be written to the disk. Since the reference signal is synchronized to disk rotation, the clock signal will also be synchronous. It will therefore reflect variations in disk speed and aid consistent spacing of disk patterns written. Accordingly, gap size requirements are minimized. This feature makes the invention suitable for use in either fixed or variable block architectures.

In addition, the use of a relatively low frequency reference signal for generating the high frequency clock signal significantly lowers the bandwidth of the control circuit as compared to a PLL, thus eliminating the undesirable effects of jitter introduced by high frequency reference signals.

Finally, the implementation described below is well-suited to zoned recording. Changes in clock frequency merely involve a register with a new value corresponding to a desired bit density.

From the foregoing, it should be apparent that a primary object of the present invention is to provide a clock generating circuit for producing a synchronous high frequency write clock signal from a relatively low frequency reference signal, e.g. as low as one cycle per disk revolution.

It is a further object of this invention to provide a clock generating circuit for producing a synchronous high frequency write clock signal from a low frequency reference signal wherein the low frequency reference signal is provided by either dedicated servo or sector servo patterns, or from the spindle controller.

A further object of this invention is to provide a synchronous clock generating circuit which minimizes gap size requirements so that the circuit is well-suited for either FBA or CKD architectures.

Finally, it is an object of the present invention to provide a synchronous clock generator circuit capable of fast and frequent readjustment as required by zoned recording.

The foregoing and other objects, features and advantages of the present invention will be apparent from the following detailed description of the preferred embodiments of the invention, taken in conjunction with the accompanying drawings.

DESCRIPTION OF THE PREFERRED EMBODIMENT

Figure 1:
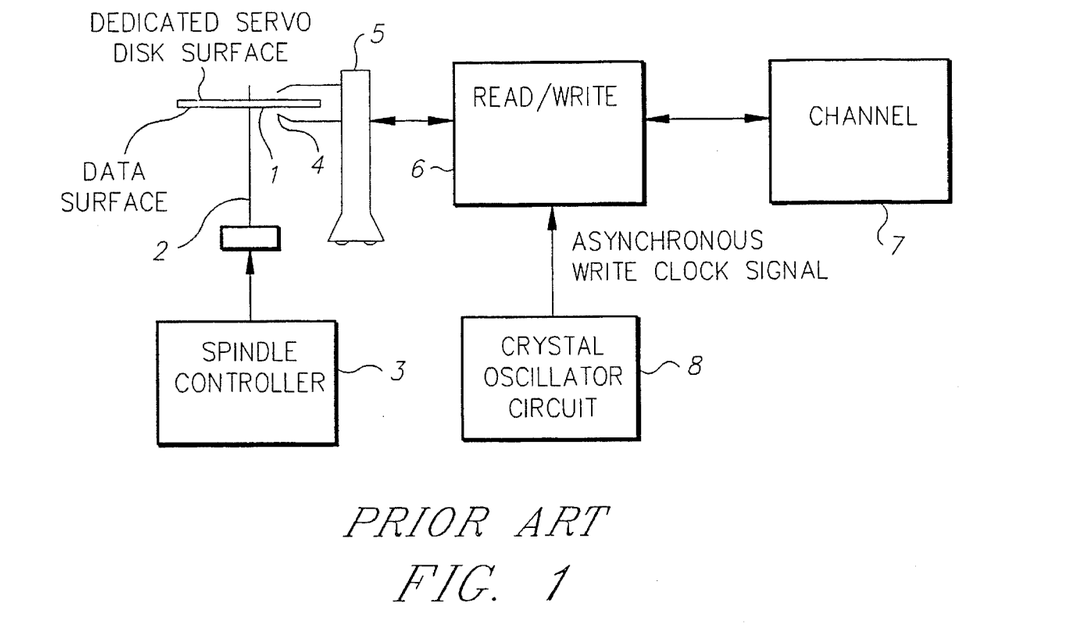
FIG. 1 is a simplified block diagram of a currently used disk drive utilizing an asynchronous clock provided by a crystal oscillator.
Figure 2:
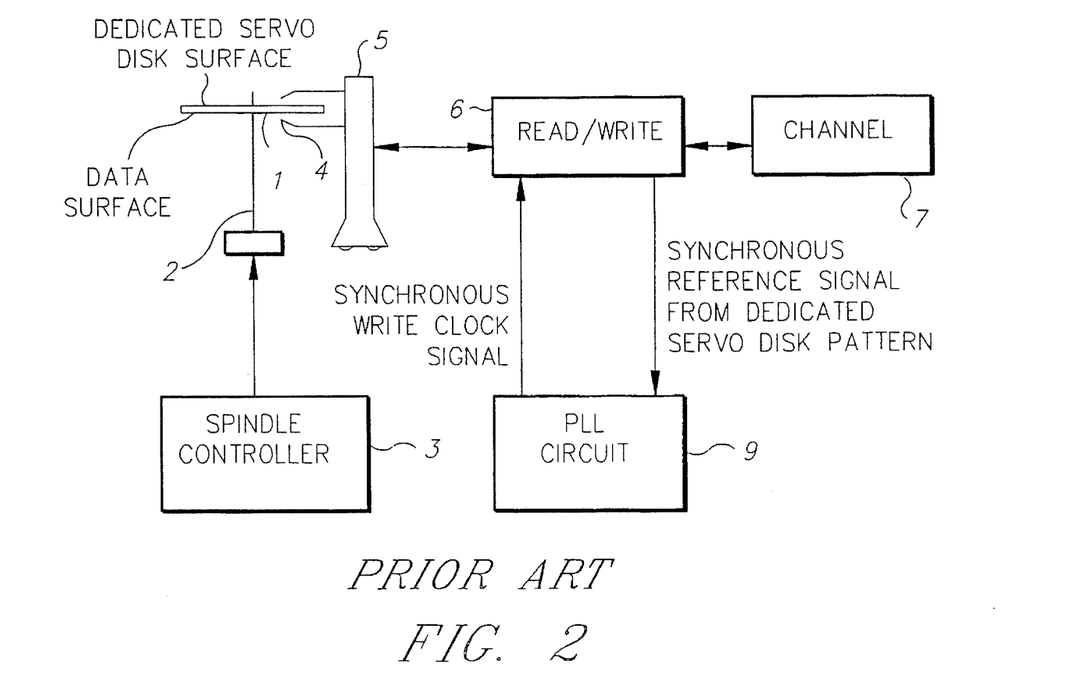
FIG. 2 is a simplified block diagram of a disk drive with dedicated servo architecture employing a PLL synchronous clock generating circuit.

Currently used implementations of write clock generators described in the background are shown in FIGS. 1 and 2. FIG. 1 functionally depicts a disk drive having a crystal oscillator circuit which provides an asynchronous write clock. The drive comprises a disk 1, a spindle 2, a spindle controller 3, a head 4 for reading or writing, an actuator 5, read/write and servo processing means 6, a channel 7, and an oscillating circuit 8. For reasons discussed above, such a disk drive will normally have fixed block format. The system described is suitable for either sector servo or dedicated servo architectures. FIG. 2 shows a dedicated servo disk drive with a synchronous write clock provided by a PLL circuit 9. The drive may have either a fixed block or variable block format. However, by necessity it will have a dedicated servo architecture.

Figure 3:
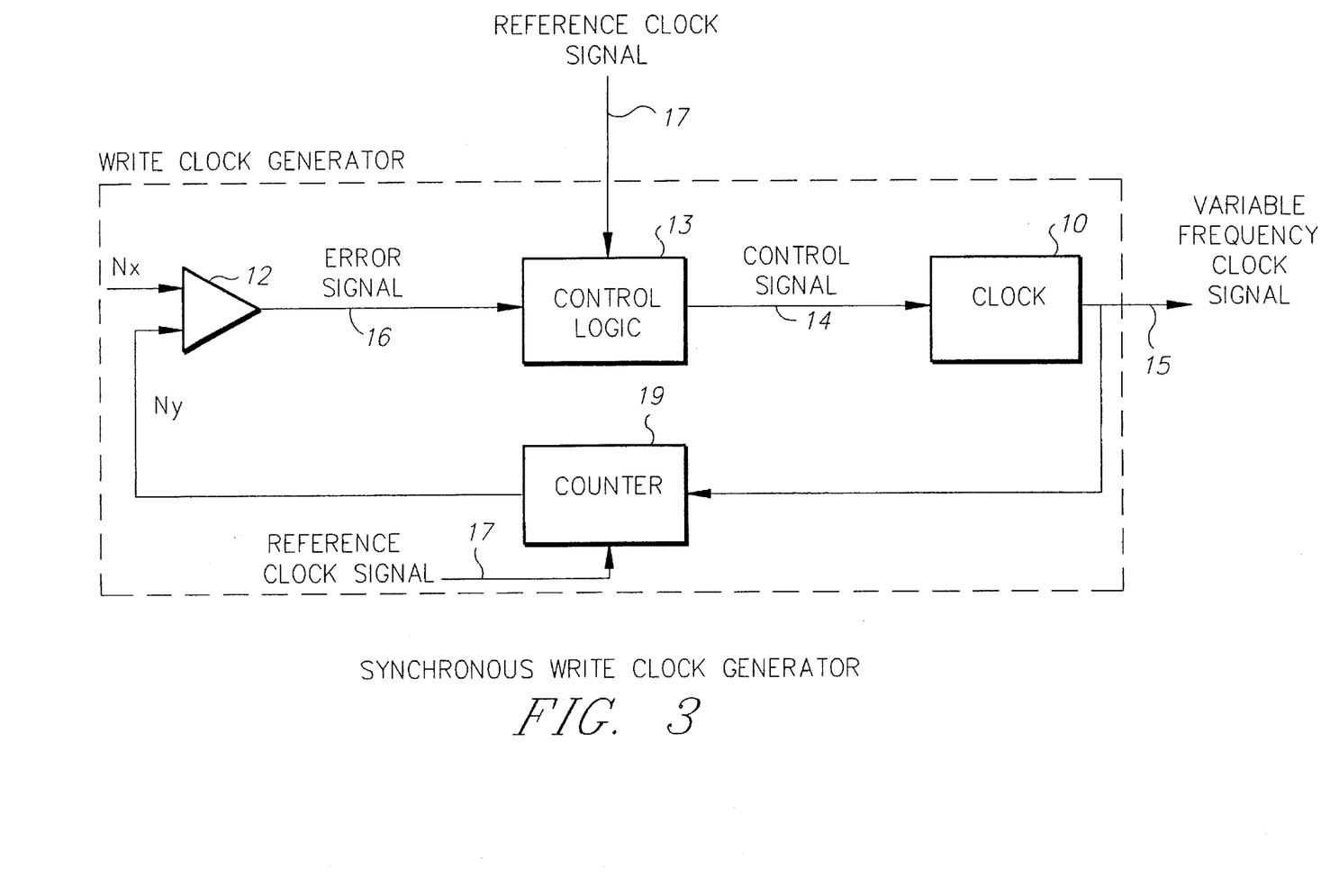
FIG. 3 is a simplified block diagram of the present invention.

The clock generator of the present invention is illustrated in the block diagram of FIG. 3. It comprises a variable frequency oscillator (VFO) 10, a counter 19, comparing means 12, and control logic 13. The VFO 10 receives a control signal 14, and generates a clock signal 15. The counter 19 is coupled to the clock signal 15 and an external reference clock signal 17, and generates a count value Ny. The comparing means 12 receives count value Ny and an expected count value Nx, and generates an error signal 16. The error signal 16 is received by the control logic 13, which also receives a reference clock signal 17 and generates a control signal 14.

During normal operation, the reference clock signal 17 has a nominal frequency generally less than 1/20 of the desired clock signal frequency and is proportional to the rotational speed of the spindle. Its actual frequency may vary somewhat with respect to this nominal frequency due to variations in the spindle speed. The VFO 10 provides clock signal 15 having a predetermined number of cycles for each period of the reference clock signal 17. The number of cycles generated will correspond approximately to the desired bit spacing frequency. For each reference period, the counter 19 initiates a sequence to count the number of clock cycles generated. The count value Ny obtained for each reference period is then provided to the comparing means 12. The comparing means 12 compares count value Ny to expected count value Nx. The expected count value Nx accurately corresponds to the desired bit spacing frequency. The comparing means 12 generates error signal 16 reflecting any difference between the compared values. The control means 13 transforms the error signal 16 into an appropriate control signal 14 supplied to the VFO 10. The control signal 14 causes the VFO 10 to increase or decrease the clock signal frequency.

The VFO 10, counter 19, comparing means 12, and control logic 13 comprise a feedback loop. As fluctuations in the reference signal frequency occur, these elements respond to readjust the frequency of clock signal 15.

Figure 4:
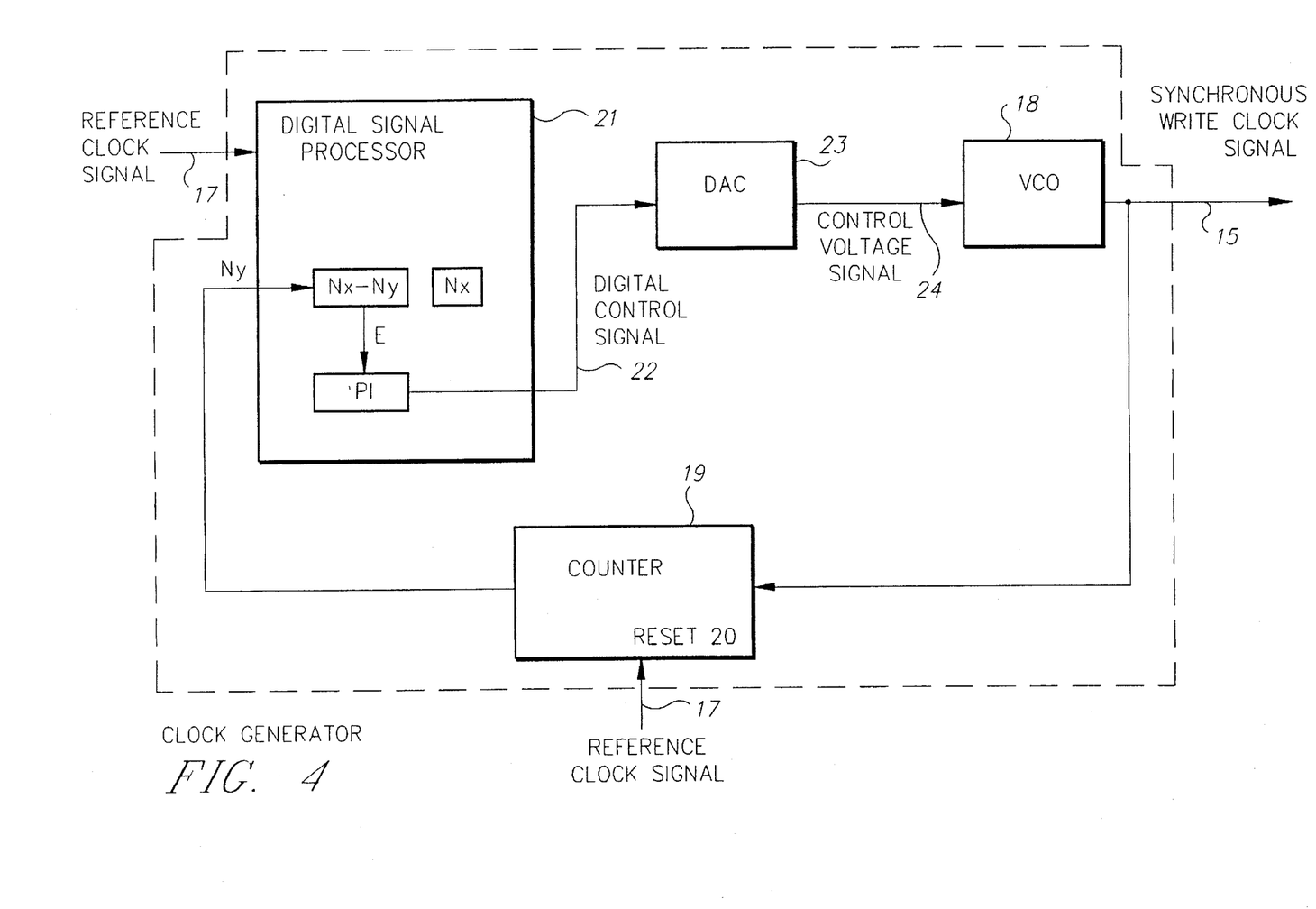
FIG. 4 is a simplified block diagram of a disk drive embodying the present invention.

The preferred embodiment of the clock signal generator is shown in FIG. 4. The embodiment is implemented in a disk drive having sector servo and CKD architecture. The disk-synchronous reference clock signal 17 is provided by reading sector servo identification marks as the disk 1 rotates. However, the reference signal may also originate from any repeating low-frequency disk pattern, or alternatively from spindle index pulses or spindle encoder pulses. This reference clock signal 17 is supplied to the clock generator circuit as shown.

A voltage control oscillator 18 (VCO), such as the commercially available Texas Instruments 74124, generates a write clock signal 15 having a predetermined number of cycles for each pulse of the reference clock signal 17. The VCO output 15 is coupled to a counter 19, such as the Texas Instruments 74AS161. The counter reset input 20 is coupled to the reference clock signal 17, allowing it to count the actual number (Ny) of write clock cycles generated for each reference clock pulse.

Count Ny is provided to a digital signal processor (DSP) 21, which uses this value to generate a digital control signal 22 for the VCO 18 via a software-implemented control algorithm. The DSP 21 has memory for storing the predetermined number, Nx, representing the desired number of write clock cycles to be generated. Nx corresponds to the desired frequency of the write clock 15 to be generated by the circuit. The DSP 21 subtracts Ny from Nx in software, and supplies the resultant error (E) to a software proportional-plus-integral (PI) control algorithm.

PI control algorithms are generally known by those skilled in the relevant art. Briefly, a control algorithm is used in a feedback loop to generate an appropriate control signal from a given error signal. In the preferred embodiment, the error signal is the difference Ny-Nx, and the control signal is a digital control output 22 that is subsequently converted by a digital-to-analog converter (DAC) 23 into a control voltage 24 and applied to the VCO 18. A PI control algorithm has two components. The first component is proportional to the error (E), e.g. (Ny-Nx). The second component is proportional to the integral of the error. The integral component insures that over time, the error is forced to zero, resulting in a control that linearly changes with time.

Alternative control algorithms may also be used. For example, a proportional-plus-integral-plus-differential (PID) algorithm adds a component which is proportional to the rate of change of the error. Alternatively, a "lead-lag" algorithm may be used to optimize the overall performance of the system. The basic function of each of the algorithms mentioned is to drive the error to zero.

In the preferred embodiment, the DSP 21 implements the PI control algorithm and outputs the digital control signal 22. The DSP output is coupled to a DAC 23, such as the commercially available Analog Devices AD767. The DAC 23 converts the digital control signal into an analog voltage signal 24 for controlling the VCO 18. This control voltage signal 24 adjusts the frequency of the write clock 15 generated by the VCO 18 either up or down to achieve and maintain a desired clock frequency relative to the variable reference clock frequency.

Figure 5:
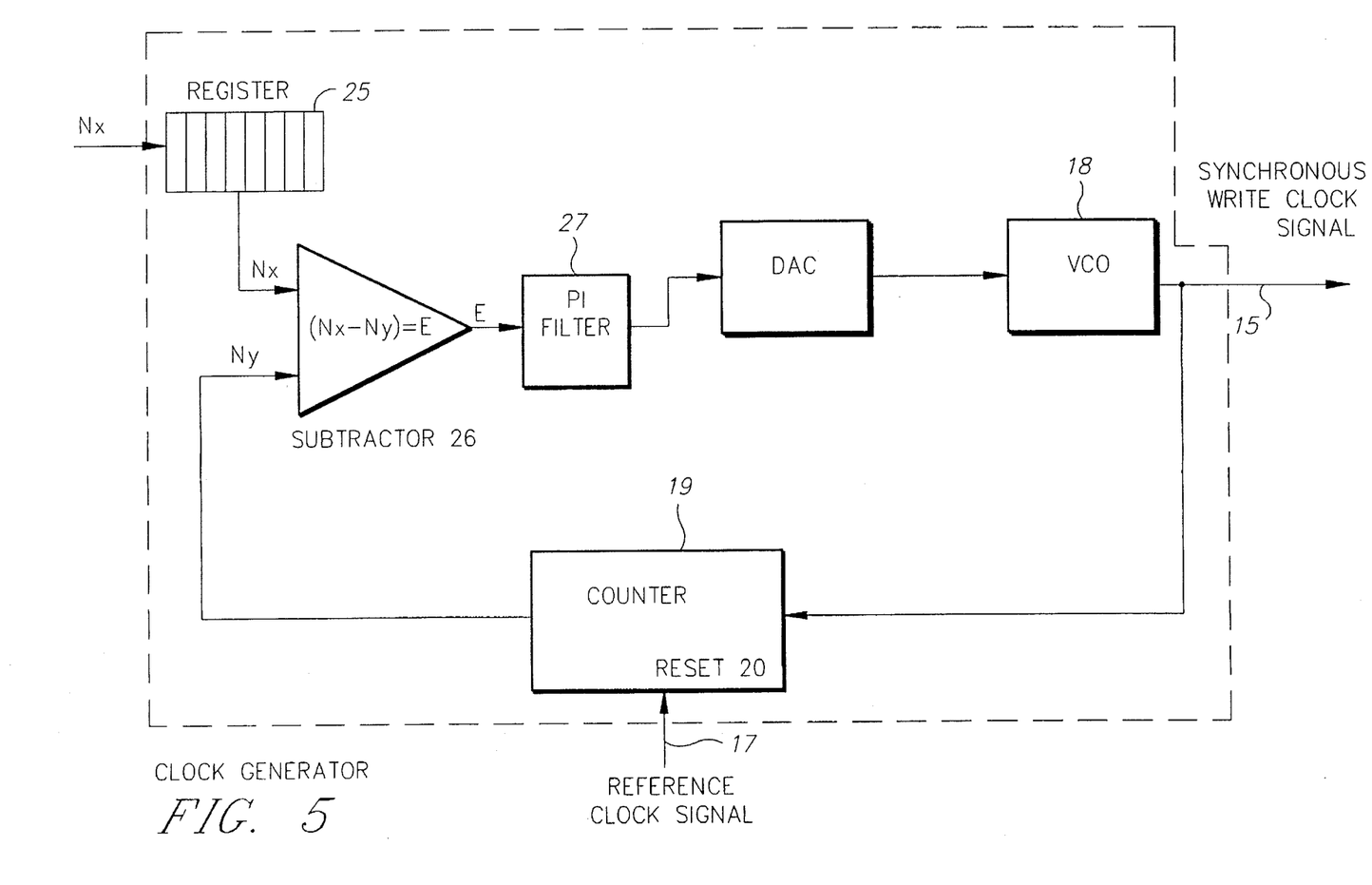
FIG. 5 is a detailed, preferred embodiment of the present invention.

An alternative embodiment of the present invention is shown in FIG. 5. In the circuit shown, the DSP is replaced by a hardware register 25 containing the desired count Nx, a hardware subtractor circuit 26 for generating the difference (Ny-Nx), and a hardware digital filter network 27 to implement the PI control algorithm. Changes to the generated clock frequency are effected by loading a new value Nx into register 25. Thus the design of FIG. 5 would be well-suited for zoned recording.

It is to be understood that the disclosed clock generating circuit may also be integrated into a single custom chip having an input for the synchronous reference clock, a microprocessor interface port for programming the desired count Nx and the control algorithm parameters, and an output for the generated clock signal.

Figure 6:
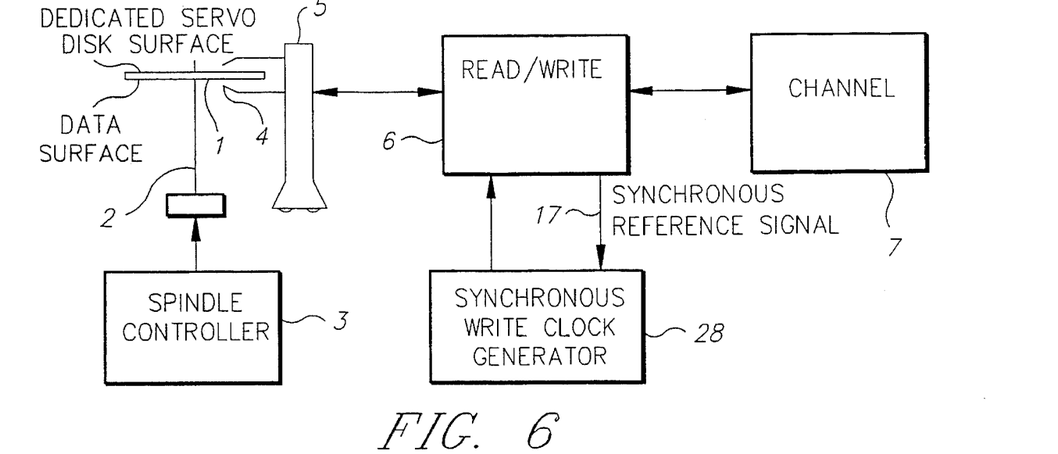
FIG. 6 is a simplified block diagram illustrating an alternate embodiment of a disk drive utilizing the present invention.

FIG. 6 illustrates the preferred functional embodiment of a disk drive system using the clock generator of FIG. 4. A disk drive is shown having at least one disk 1, a spindle 2, spindle control means 3, a read/write head 4, an actuator 5, read/write and servo processing means 6, a channel 7, and write clock generating means 28.

The system has a CKD architecture and the disk 1 is formatted with sector servo information. During normal operation the disk is rotated by the spindle 2, and the speed of rotation is determined by the spindle controller 3. Rotation occurs at a nominal speed, but may vary somewhat from that speed. The head 4 is positioned over disk 1 by actuator 5 to read a sector servo pattern. The pattern occurs on the disk 1 at least once per revolution. The information detected by the head 4 is then provided to the read/write and servo processing means 6, which translates the information into reference signal 17. Since the speed of disk 1 rotation may vary, the frequency of the reference signal 17 may also vary from a nominal frequency. Reference signal 17 is provided to the write clock generator 28 (FIG. 4 described above), which generates the write clock signal 15 to the read/write and servo processing means 6.

Figure 7:
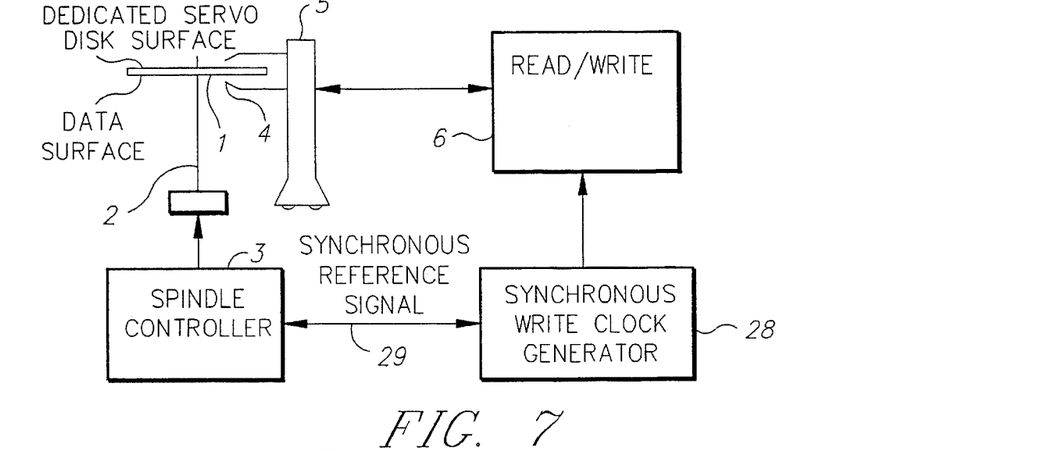
FIG. 7 is a simplified block diagram of another alternative embodiment of a disk drive utilizing the present invention.

FIG. 7 illustrates an alternative disk drive system configuration wherein the reference signal is provided by the spindle controller 3. In this embodiment a spindle encoder pulse or other spindle pattern is converted into a synchronous reference signal 29 and provided to the clock generator 28.

Figure 8:
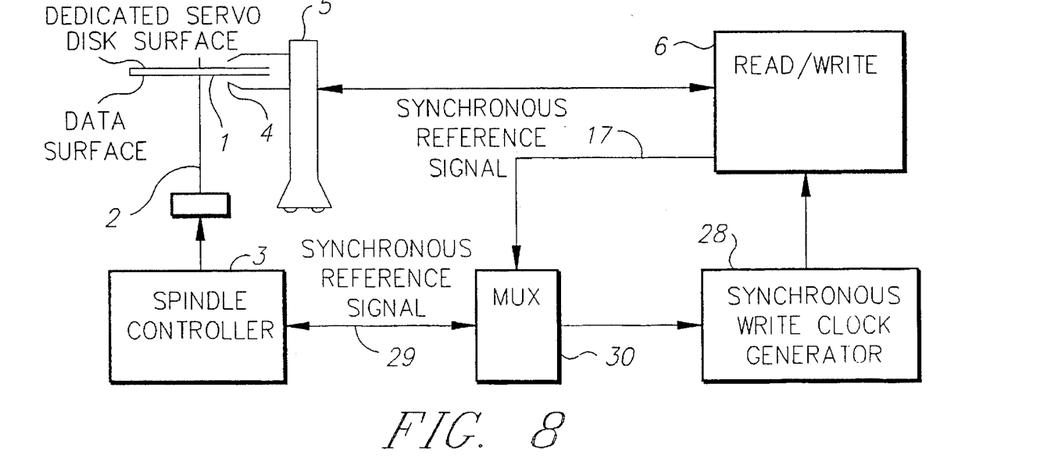
FIG. 8 is a simplified block diagram of another alternative embodiment of a disk drive combining the features of the embodiments shown in FIG. 6 and FIG. 7.

Finally, FIG. 8 depicts a disk drive system allowing selection of reference signals through a multiplexor (MUX) 30. A choice is given between a reference signal 17 originating from a disk pattern and a reference signal 29 originating from a spindle controller pattern. The function of the MUX 30 may be implemented by a programmable select through the channel. Implementation of a MUX or a programmable select would be obvious to persons skilled in the relevant art.

While the invention has been shown and described with reference to a preferred embodiment thereof, it will be understood by those skilled in the art that various changes in form and detail may be made without departing from the spirit and scope of the invention. Accordingly, the invention is not to be deemed limited except as specified in the claims.

We claim:

1. Apparatus for generating a clock signal of variable frequency comprising:

means for generating a single low frequency input reference signal having a reference period which may vary from a nominal period;

means for generating a clock signal having a number of clock cycles during the reference period corresponding to a predetermined bit spacing frequency;

means for counting the number of clock cycles generated during the reference period;

means for generating the difference between the number of clock cycles counted during the reference period and a predetermined number of clock cycles expected during the reference period for generating an error signal; and means coupled to the clock signal generating means and responsive to the error signal for increasing or decreasing the clock signal frequency by a discrete amount for immediately synchronizing the clock signal frequency to said single low frequency input reference signal.

2. The apparatus of claim 1, wherein the clock signal generating means comprises a variable control oscillator (VCO).

3. The apparatus of claim 2 wherein the error signal generating means, and the means for adjusting the clock signal frequency further comprise a digital signal processor (DSP) coupled to a digital to analog converter (DAC).

4. The apparatus of claim 1, wherein the means for increasing or decreasing the clock signal frequency further comprises means for transforming the error signal into a control voltage for varying the frequency of the clock signal.

5. The apparatus of claim 4, wherein the means for transforming the error signal into a control voltage further comprises:

a filter having a discrete time transfer function for filtering the error signal; and a digital to analog converter (DAC) coupled to the filter for generating the control voltage.

6. The apparatus of claim 5, wherein the transfer function of the filter is implemented by software.

7. The apparatus of claim 4, further comprising means coupled between the error signal transforming means and the clock signal generating means for filtering the control voltage.

8. The apparatus of claim 1, wherein said single low frequency input reference signal has a frequency less than 1/20 of the desired clock signal frequency.

9. The apparatus of claim 1, wherein the means for counting the number of clock cycles comprises a counter having a reset input responsive to said single low frequency input reference signal, and wherein the counter counts the number of clock cycles generated between two consecutive reference signals.

10. A data recording disk drive system comprising:

a disk having a surface for storing information thereon;

a spindle for rotating the disk;

means for controlling the spindle rotation;

means coupled to the disk for generating a single low frequency reference signal synchronized to the rotation of the disk, said single low frequency reference signal having a nominal frequency and a reference period which may vary from a nominal period;

means responsive to said single low frequency reference signal for generating a variable write clock signal having a write clock cycle, said write clock signal synchronized to the rotation of the disk and having a nominal frequency corresponding to a predetermined bit spacing frequency;

means for counting the number of write clock cycles generated during the reference period;

means for generating the difference between the number of write clock cycles counted during the reference period and a predetermined number of write clock cycles expected during the reference period for generating an error signal therefrom;

means coupled to the write clock generating means and responsive to the error signal for increasing or decreasing the frequency of the write clock signal by a discrete amount for immediately correcting and synchronizing said write clock signal frequency to said single low frequency reference signal; and means for receiving said immediately corrected and synchronized write clock signal and writing information onto the disk.

11. The disk drive system of claim 10, wherein the write clock generating means comprises a variable control oscillator (VCO).

12. The disk drive system of claim 11, further comprising means coupled between the error signal transforming means and the VCO for filtering the control voltage.

13. The disk drive system of claim 10, wherein the means for adjusting the frequency of the write clock signal further comprises means for transforming the error signal into a control voltage for varying the frequency of the write clock signal.

14. The disk drive system of claim 13, wherein the means for transforming the error signal into a control voltage further comprises:

a filter having a discrete time transfer function for filtering the error signal; and a digital to analog converter coupled to the filter for generating the control voltage.

15. The disk drive system of claim 14, wherein the transfer function of the filter is implemented in software.

16. The disk drive system of claim 10 wherein the error signal generating means, and the means for adjusting the clock signal frequency further comprises a digital signal processor (DSP) coupled to a digital to analog converter (DAC).

17. The disk drive system of claim 10, wherein said single low frequency reference signal has a frequency less than 1/20 of the desired clock signal frequency.

18. The disk drive system of claim 10, wherein the means for counting write clock cycles comprises a counter having a reset input responsive to said single low frequency reference signal, wherein the counter counts the number of write clock cycles generated between two consecutive reference signals.

19. The disk drive system of claim 10, wherein the means for generating said single low frequency reference signal is included within the means for controlling the spindle.

20. The disk drive system of claim 10, wherein the means for generating said single low frequency reference signal further comprises means for reading information from the disk and generating said single low frequency reference signal therefrom.

21. The disk drive system of claim 10, wherein the disk further comprises a plurality of concentric zones, each zone including a plurality of tracks; and wherein the disk drive system further includes means for adjusting the nominal frequency of the write clock signal whenever the writing means are positioned at the innermost track of a zone.

22. The disk drive system of claim 10, wherein the disk includes a pattern written on its surface, and wherein said single low frequency reference signal generating means includes means for detecting the pattern on the rotating disk generating said single low frequency reference signal therefrom.

23. The disk drive system of claim 22, wherein the pattern is a servo pattern.

24. The disk drive system of claim 22, wherein the pattern is a sector servo identification mark.

25. The disk drive system of claim 22, wherein the pattern is an index mark.

26. The disk drive system of claim 22, wherein the pattern is a dedicated servo timing mark.

27. The disk drive system of claim 10, wherein the means for controlling the spindle rotation includes means for generating a spindle encoder pulse, and wherein said single low frequency reference signal generating means includes means for detecting the spindle encoder pulse and generating said single low frequency reference signal therefrom.

28. The disk drive system of claim 10, wherein the means for controlling the spindle rotation includes means for generating a spindle index pulse, and wherein said single low frequency reference signal generating means includes means for detecting the spindle index pulse and generating said single low frequency reference signal therefrom.

* * * * *